(12) United States Patent
Ishibashi et al.

(10) Patent No.: US 7,925,998 B2
(45) Date of Patent: Apr. 12, 2011

(54) DELAY CALCULATING METHOD IN SEMICONDUCTOR INTEGRATED CIRCUIT

(75) Inventors: Noriko Ishibashi, Mishima-gun (JP); Masaaki Hirata, Ideda (JP); Nobufusa Iwanishi, Hirakata (JP)

(73) Assignee: Panasonic Corporation, Osaka (JP)

( * ) Notice: Subject to any disclaimer, the term of this patent is extended or adjusted under 35 U.S.C. 154(b) by 420 days.

(21) Appl. No.: 11/296,640

(22) Filed: Dec. 8, 2005

(65) Prior Publication Data

US 2007/0300196 A1 Dec. 27, 2007

(30) Foreign Application Priority Data

Dec. 8, 2004 (JP) ................... 2004-355600

(51) Int. Cl.
*G06F 17/50* (2006.01)
(52) U.S. Cl. ............. 716/6; 716/108; 716/113; 716/134
(58) Field of Classification Search .................. 716/1–6, 716/9–10, 106–108, 113–115, 134; 703/14–19
See application file for complete search history.

(56) References Cited

U.S. PATENT DOCUMENTS

| | | | | |
|---|---|---|---|---|
| 5,274,568 | A * | 12/1993 | Blinne et al. | 716/6 |
| 5,655,109 | A * | 8/1997 | Hamid | 716/18 |
| 5,894,421 | A * | 4/1999 | Yamaguchi et al. | 716/6 |
| 6,516,454 | B1 * | 2/2003 | Hirata et al. | 716/6 |
| 6,615,164 | B1 * | 9/2003 | Gopisetty et al. | 703/2 |
| 6,622,291 | B1 * | 9/2003 | Ginetti | 716/9 |
| 6,912,702 | B1 * | 6/2005 | Iyer et al. | 716/6 |
| 7,051,305 | B1 * | 5/2006 | Ha et al. | 716/6 |
| 7,456,660 | B2 * | 11/2008 | Kurokawa | 326/114 |
| 2002/0138809 | A1 * | 9/2002 | Roethig et al. | 716/1 |
| 2002/0183957 | A1 * | 12/2002 | Croix et al. | 702/127 |
| 2003/0177455 | A1 * | 9/2003 | Kaufman et al. | 716/2 |
| 2003/0204828 | A1 * | 10/2003 | Iwanishi | 716/6 |
| 2004/0002844 | A1 * | 1/2004 | Jess et al. | 703/14 |
| 2004/0025136 | A1 * | 2/2004 | Carelli, Jr. | 716/17 |
| 2004/0078767 | A1 * | 4/2004 | Burks et al. | 716/8 |
| 2004/0194043 | A1 * | 9/2004 | Sundar et al. | 716/5 |
| 2004/0216069 | A1 * | 10/2004 | Fujita et al. | 716/11 |
| 2005/0278671 | A1 * | 12/2005 | Verghese et al. | 716/6 |

OTHER PUBLICATIONS

Library Characterization and Modeling for 130nm and 90nm SOC Design, IEEE SOC Conference, Sep. 19, 2003, Wolfgang Roethig, NEC Electronic America (Note 2 parts: Library Modeling Tutorial part and Simucad Design Automation part "http://ece-classweb.ucsd.edu/fall09/ece260a/Library_Char_Dynamic_IR_Tutorial.pdf".*
Application of Logical Effort on Design of Arithmetic Blocks (Xiao Yan Yu, Vojin Oklobdzija, and William Walker), 35th Asilomar Conference on Signals, Systems, and Computers, Pacific Grove, California, Nov. 4-7, 2001.*

* cited by examiner

*Primary Examiner* — Paul Dinh
(74) *Attorney, Agent, or Firm* — McDermott Will & Emery LLP

(57) ABSTRACT

An input pin capacitance of a cell is obtained in advance in a function expression, and a delay is calculated in such manner that the input pin capacitance is calculated in functions of an input slew and a drive load capacitance in each instance. In a cell characterizing process, a total volume of a current running into an input terminal before a voltage value of the input terminal reaches a reference voltage is obtained so that a value approximate to a real input pin capacitance can be obtained.

8 Claims, 18 Drawing Sheets

| | Load1 | Load2 | Load3 | Load4 |
|---|---|---|---|---|
| Slew1 | Cin11 | Cin12 | Cin13 | Cin14 |
| Slew2 | Cin21 | Cin22 | Cin23 | Cin24 |
| Slew3 | Cin31 | Cin32 | Cin33 | Cin34 |

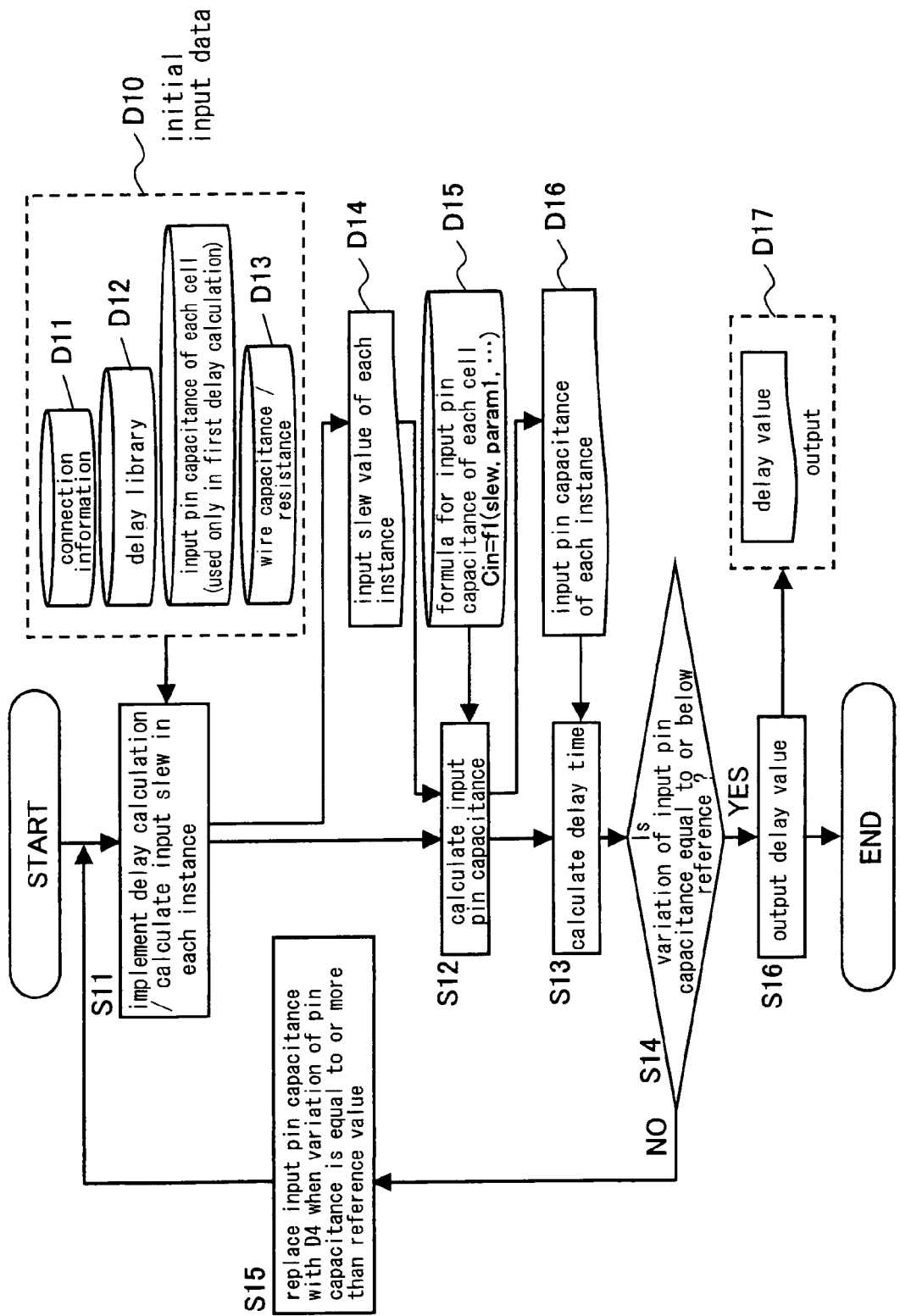
F I G. 1

FIG. 2

| input slew | input pin capacitance |
|---|---|
| Slew1 | Cin1 |
| Slew2 | Cin2 |
| Slew3 | Cin3 |

FIG. 3

|  | Load1 | Load2 | Load3 | Load4 |
|---|---|---|---|---|
| Slew1 | Cin11 | Cin12 | Cin13 | Cin14 |
| Slew2 | Cin21 | Cin22 | Cin23 | Cin24 |
| Slew3 | Cin31 | Cin32 | Cin33 | Cin34 |

F I G. 5

| drive load | input pin capacitance |
|---|---|
| C1 | Cin1 |
| C2 | Cin2 |
| C3 | Cin3 |

F I G. 6
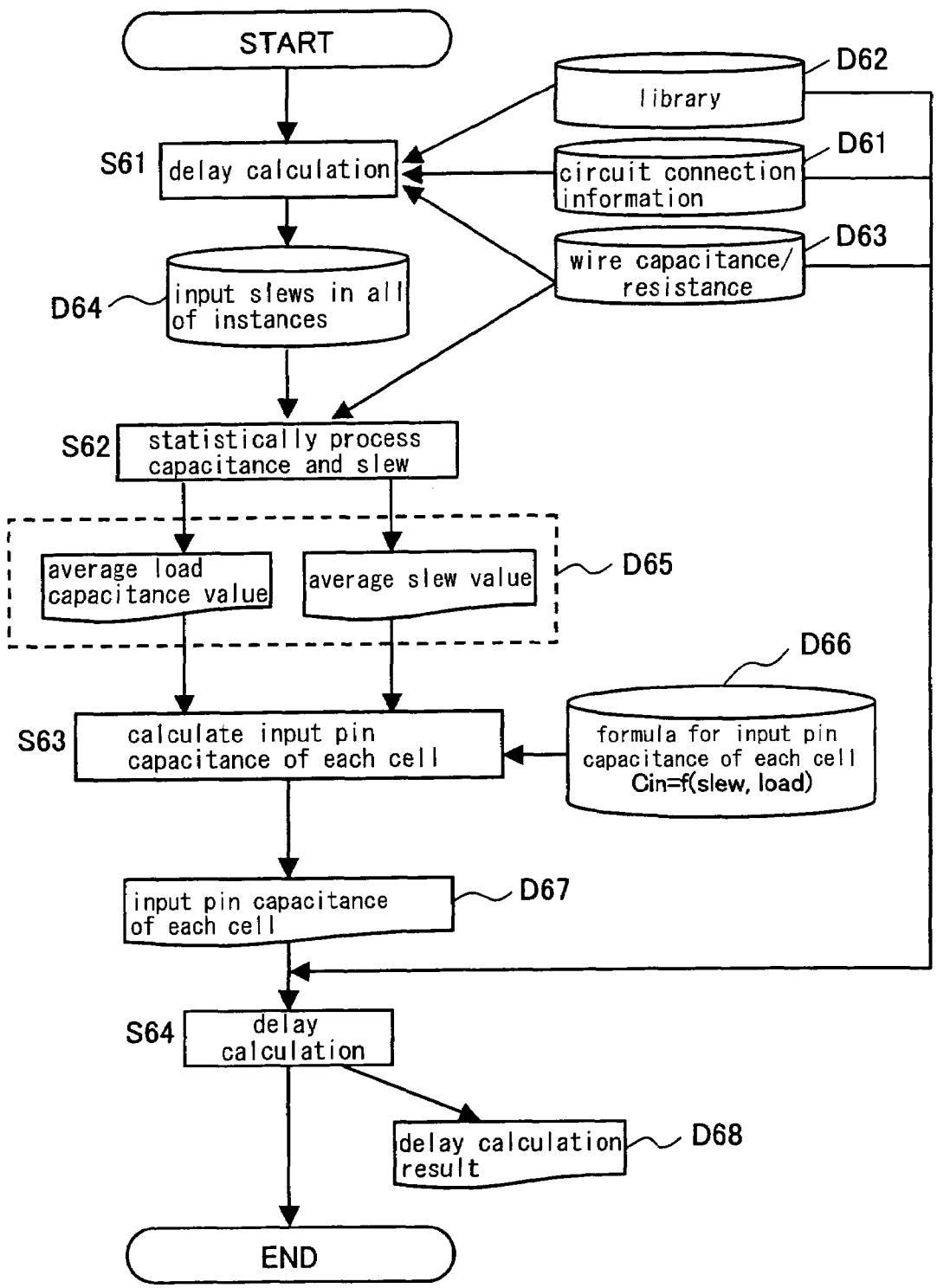

F I G. 7
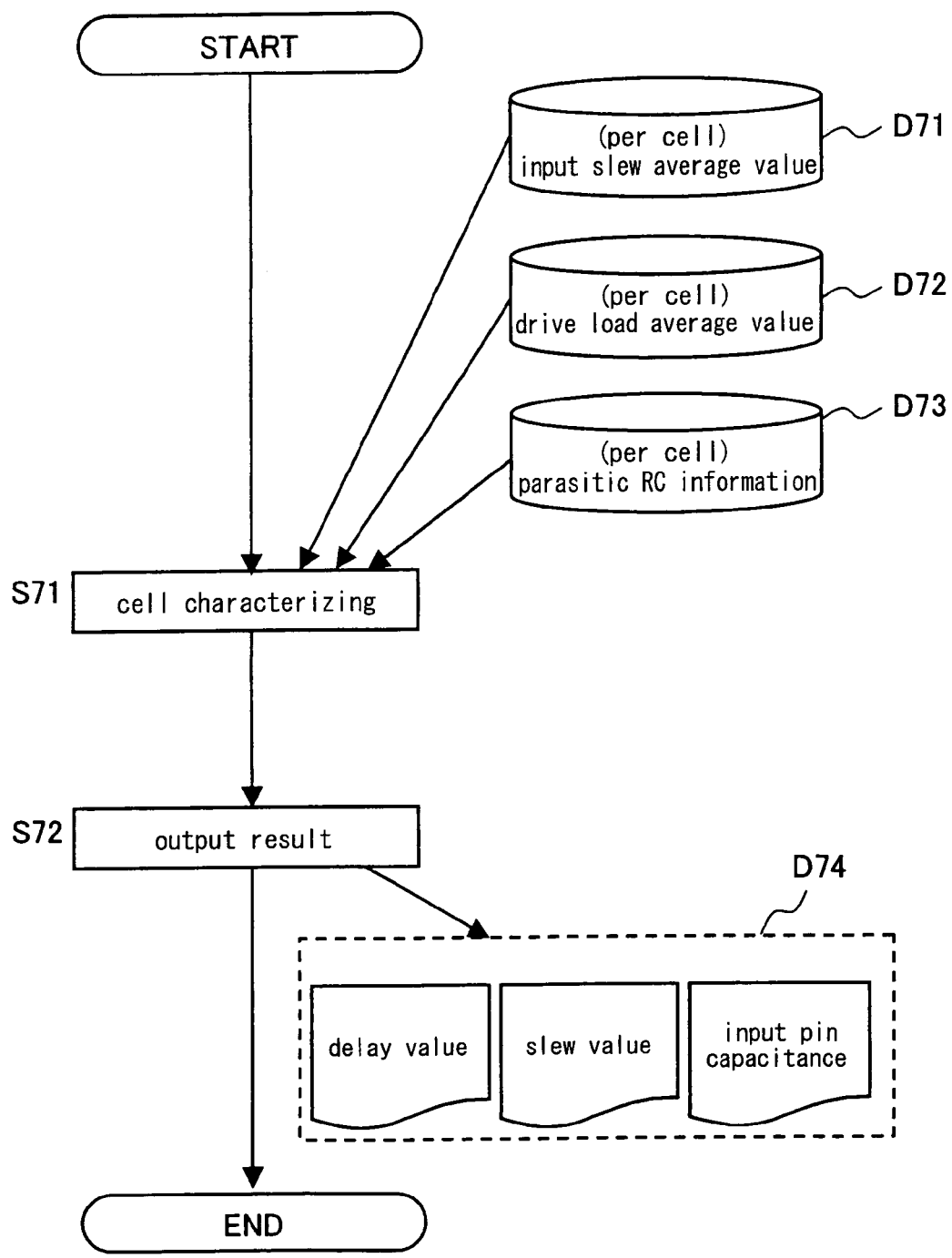

F I G. 9
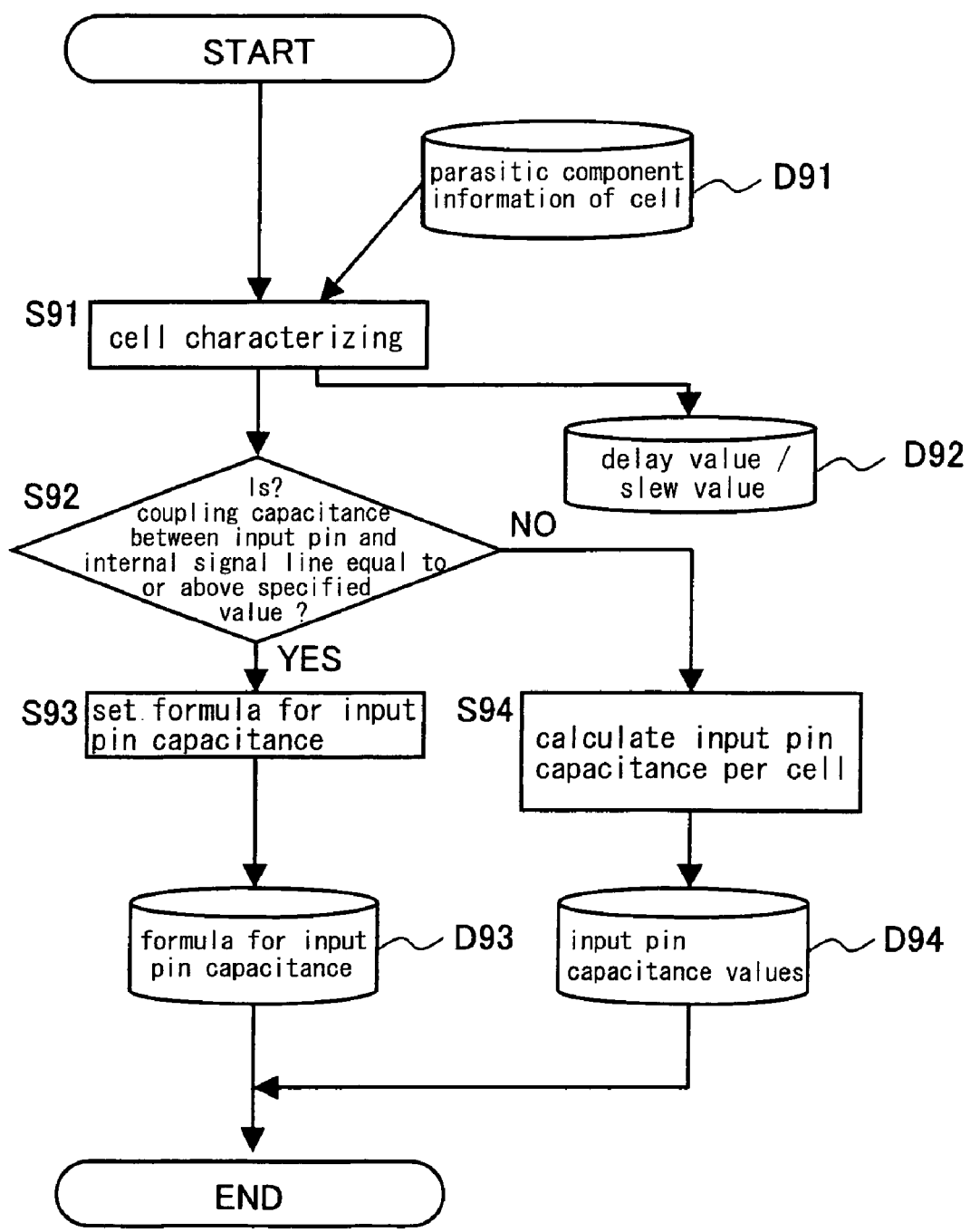

F I G. 1 0
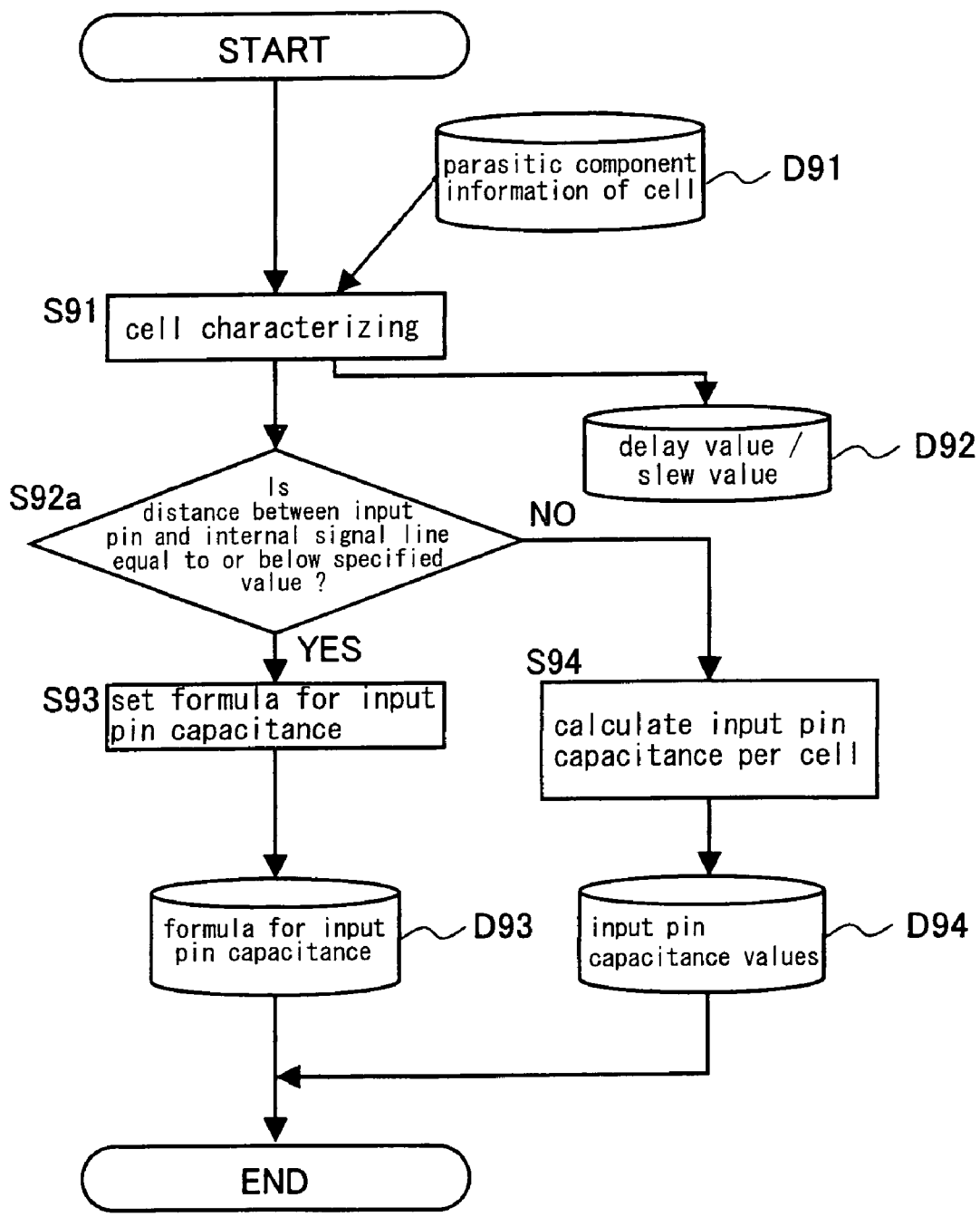

F I G. 1 2
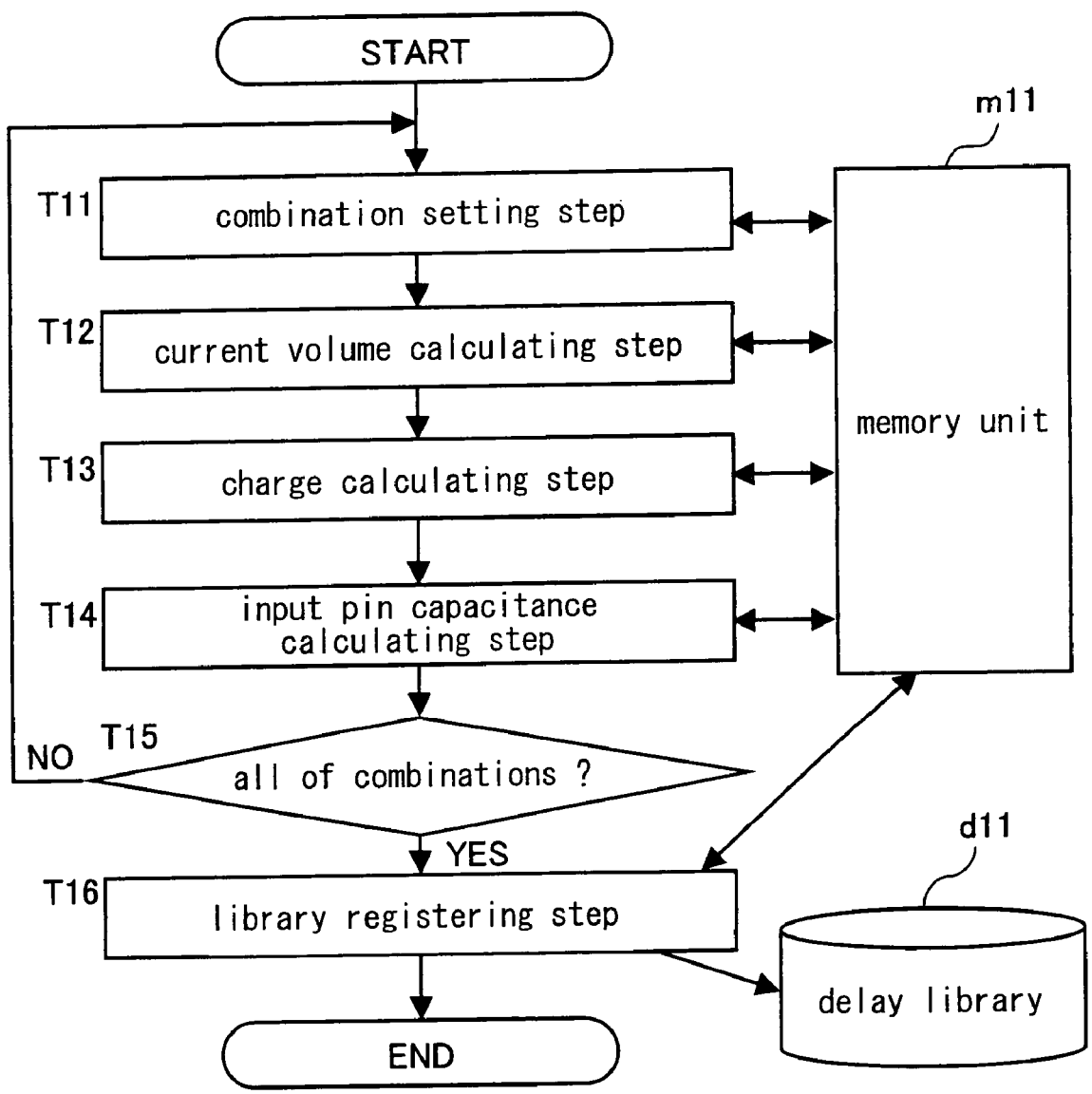

FIG. 16 net 1

| C1 | o1 | 0 | 10f |
|----|----|---|-----|
| C2 | i2 | 0 | 10f |
| C3 | n1 | 0 | 10f |
| C4 | n2 | 0 | 10f |
| C5 | n3 | 0 | 10f |
| C6 | i3 | 0 | 10f |
| C7 | i4 | 0 | 10f | net2

| C8 | o2 | 0 | 10f |
|----|----|---|-----|
| C9 | i5 | 0 | 10f | net3

| C10 | o3 | 0 | 10f |
|-----|----|---|-----|
| C11 | i6 | 0 | 10f | net4

| C12 | o4 | 0 | 10f |
|-----|----|---|-----|
| C13 | i7 | 0 | 10f |

F I G. 1 7 net 1

| | | | |
|---|---|---|---|
| C1 | o1 | 0 | 10f |
| C2 | i2 | 0 | 10f |
| C3 | n1 | 0 | 10f |
| C4 | n2 | 0 | 10f |
| C5 | n3 | 0 | 10f |
| C6 | i3 | 0 | 10f |
| C7 | i4 | 0 | 10f |
| △C2 | i2 | 0 | -3f |
| △C6 | i3 | 0 | -2f |
| △C7 | i4 | 0 | -1f | added

F I G. 1 9
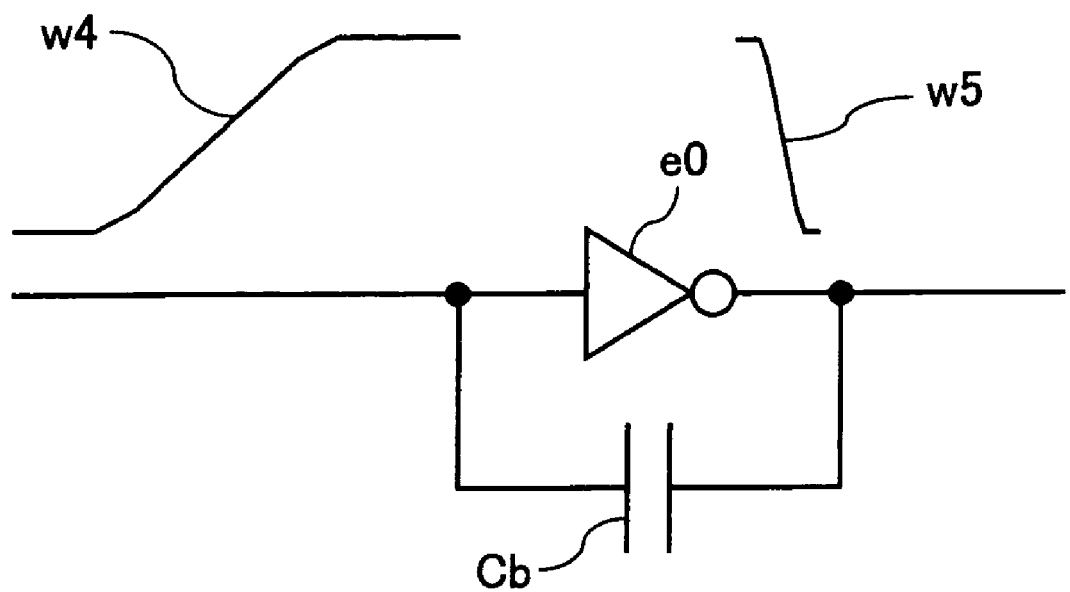
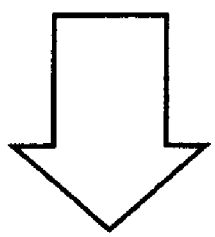
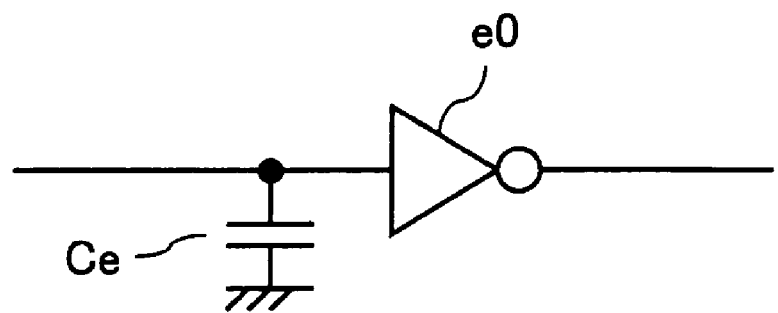

DELAY CALCULATING METHOD IN SEMICONDUCTOR INTEGRATED CIRCUIT

BACKGROUND OF THE INVENTION

1. Field of the Invention

The present invention relates to a delay calculating method in a semiconductor integrated circuit and a cell characterizing method used in the delay calculation.

2. Description of the Related Art

In a final state of designing LSI, a delay calculation is processed for timing verification. In the delay calculation, a delay information of a cell used in a design data, a capacitance and a resistance value parasitizing a wiring, and a connection information of the cell are inputted in order to calculate how much delay value is generated in respective instances (logic element, logic gate, circuit block and the like) and wiring. The timing verification is performed based on a result of the delay calculation and design restrictions.

The delay calculation requires a delay library in which the delay information of the cell and an input pin capacitance value are registered. In the generation of the library for the delay calculation (extraction of a characteristic of the cell), the input pin capacitance value of the cell is extracted and registered in the delay library to be used in the delay calculation.

The value of the input pin capacitance is generally registered in the delay library as a value having a width such as one value or a maximum value and a minimum value as shown in, for example, the Library compiler User Guide or Prime Time User Guide (Synopsys Inc), which is hereinafter referred to as a conventional technology 1.

A method of calculating the input pin capacitance when the delay is calculated by obtaining one representative value of the input pin capacitance value and multiplying the one representative value by a coefficient dependent on an input slew (slew: how round a signal pulse is) was proposed, an example of which is recited in No. WO99/22320 of the PCT Publication. The method is hereinafter referred to as a conventional technology 2.

According to a conventional method of obtaining the input pin capacitance value registered in the library or the like and used, an average value of values obtained as a result of dividing an integrated value of a value of a current running into the input pin capacitance by a voltage value is registered in the library as the input pin capacitance as shown in the Signal Storm Manual (Cadence Inc.) when a delay time of the cell and a slew value in an output terminal are measured. The method is hereinafter referred to as a conventional technology 3.

However, the conventional methods have the following problems. In the conventional technology 1, the input pin capacitance is represented by one value, however, the input pin capacitance is actually different depending on an input transition with respect to the cell and a drive load capacitance. Therefore, the input pin capacitance value may be largely different to the value registered in the library depending on a status of the circuit (dimension of the input transition with respect to the cell and drive load capacitance)

Further, when the input pin capacitance having such a width as the maximum value and the minimum value is described in the conventional technology 1, it is possible to make an allowance for an amplitude of the input pin capacitance, which can include a worst value in the delay calculation. However, according to the foregoing method, the input pin capacitance can only be estimated to be relatively larger or smaller, which results in demanding an excessive margin. Therefore, the method may consequently reduce the number of obtained chips.

In the conventional technology 2, based on the understanding that the input pin capacitance is a value dependent on the input slew, a coefficient is calculated from a coefficient table provided with the input slew as an index for the input pin capacitance used as a basis, and the input pin capacitance as the basis is multiplied by the calculated coefficient so that the input pin capacitance is obtained when the delay is calculated. However, it is already known that the input pin capacitance really depends on not only the input slew but also the drive load capacitance, and the foregoing method fails to include the dependence of the input pin capacitance on the drive load capacitance. Further, the coefficient value by which the input pin capacitance value as the basis is multiplied may undergo an error because the coefficient is obtained through interpolation.

In the conventional technology 2, the error resulting from the interpolation in the input pin capacitance can be lessened when the number of points of the input slew is increased. However, the coefficient (the number of the points of the input slew) is generally obtained simultaneously when the delay value is characterized. Therefore, it is not practical to immoderately increase the coefficient. As a result, it is not possible to avoid the error generation in the coefficient by which the input pin capacitance is multiplied in the conventional technology.

Further, in the conventional technology 2, when the input pin capacitance value is obtained from the integrated value of the current running into the input capacitance value before a voltage of the input terminal shifts to a power-supply voltage or a voltage value 0 at the time of the characterization in the conventional manner, a value larger than the input pin capacitance in an actual circuit is extracted. This results in the generation of deviation in the delay calculation.

In the delay calculation, the input terminal of the cell and coupling capacitance in the cell continue to increase as a manufacturing process is increasingly finer and more precise. Because of the ongoing trend, there is such a recent problem that a delay calculation result at the cell level (gate level) does not coincide with a simulation obtained by a circuit simulator such as SPICE due to a distortion generated in a signal waveform.

SUMMARY OF THE INVENTION

Therefore, the present invention was implemented in order to solve the aforementioned problems, and a main object thereof to calculate an input pin capacitance and a delay with a high accuracy.

In order to achieve the foregoing object, a delay calculating method in a semiconductor integrated circuit according to the present invention comprises:

a function setting step in which a function for calculating an input pin capacitance of an instance constituting a cell constituting the semiconductor integrated circuit in a charactering process of the cell and expressing a predetermined parameter in the form of an argument, is set per cell;

a parameter calculating step in which a delay library of each cell, a wire capacitance and an resistance of each cell, an initial value of the input pin capacitance of the cell and a cell connection information of the cell are inputted so as to calculate the parameter in each instance;

an input pin capacitance calculating step in which the argument including the parameter obtained in the parameter calculating step is assigned to the function set in the function setting step so as to calculate the input pin capacitance in each instance; and a delay calculating step in which a delay is calculated by means of the input pin capacitance of the instance obtained in the input pin capacitance calculating step. Further, the calculation of the parameter in each instance is repeated whenever necessary.

According to the delay calculating method, the parameter such as an input slew (tilt of inputted waveform) with respect to the cell (instance) is calculated in an actual LSI, and the input pin capacitance value dependent on the parameter is calculated for each instance and used in the delay calculation. Therefore, the input pin capacitance can be calculated in each instance of each LSI in such manner that an error included therein minimized. As a result, an improved accuracy is expected in the delay calculation.

As a preferred mode of the delay calculating method, the input pin capacitance is expressed in the form of a function, wherein the input slew is expressed in the form of the argument as the parameter.

As another preferred mode of the present invention, the input pin capacitance is expressed in the form of a function in a quadratic or higher equation of the input slew, wherein the input slew is expressed in the form of the argument as the predetermined parameter. Thereby, any dependence on the input slew can be expressed so that the input pin capacitance can be more accurately obtained.

As still another preferred mode of the foregoing constitution, the input pin capacitance is expressed in the form of a function, wherein the input slew and a drive load capacitance are expressed in the form of the arguments as the predetermined parameter.

As still another preferred mode of the foregoing constitution, the input pin capacitance is expressed in the form of the function in the quadratic or higher equation of at least one of the input slew and the drive load capacitance, wherein the input slew and the drive load capacitance are expressed in the form of the arguments as the predetermined parameter.

Thereby, any dependence on the input slew and the drive load capacitance can be expressed so that the input pin capacitance can be more accurately obtained.

In the foregoing constitution, the input pin capacitance is preferably expressed in the form of a function wherein the drive load capacitance is expressed in the form of the argument as the parameter, in which case the delay calculation can be performed without the repetitive calculation because the function of the input pin capacitance does not depend on the input slew. Accordingly, the input pin capacitance is expressed in the form of the function of the drive load capacitance, and the input pin capacitance in each instance is obtained in advance by means of the function of the input pin capacitance so as to calculate the delay. As a result, the input pin capacitance can be more accurately calculated than in the conventional gate-level delay calculation which was generally employed, and a higher accuracy is assured for the delay calculation.

As another preferred constitution, the input pin capacitance is preferably expressed in the form of function in the quadratic or higher equation of the drive load capacitance, wherein the drive load capacitance is expressed in the form of the argument as the predetermined parameter. Thereby, any dependence on the drive load capacitance can be expressed so that the input pin capacitance can be more accurately obtained.

In order to solve the foregoing problems, a delay calculating method in a semiconductor integrated circuit according to the present invention comprises:

a function setting step in which a function for calculating a function of an input pin capacitance of an inductance constituting a cell constituting the semiconductor integrated circuit in a charactering process of the cell and expressing an input slew of the cell and a drive load capacitance of the cell in the form of arguments, is set per cell;

an input slew calculating step in which a delay library of each cell, a wire capacitance and an resistance of each cell, and a cell connection information of the cell are inputted so as to calculate a delay and an input slew in each instance;

a statistical processing step in which the input slew calculated in the input slew calculating step, the wire capacitance and the resistance are inputted so as to execute a statistical processing;

an input pin capacitance calculating step in which the input slew statistically processed in the statistical processing step and the drive load capacitance are assigned to the function so as to calculate the input pin capacitance in each cell; and a delay calculating step in which a delay is calculated by means of the input pin capacitance of each cell obtained in the input pin capacitance calculating step.

According to the delay calculating method, the input pin capacitance value more approximate to an actual circuit is used so as to calculate the delay in an increased number of parts in the circuit in comparison to the case of using the one representative value of the input pin capacitance registered in the delay library in advance. As a result, an improved accuracy can be achieved in the delay calculation.

Further, a delay time calculating method in a semiconductor integrated circuit comprising a plurality of connected cells according to the present invention comprises:

an input pin capacitance calculating step in which an input pin capacitance is calculated based on an integrated value of a volume of a current running into an input terminal of the cell before a predetermined specified voltage is reached; and a delay calculating step in which a delay time of the cell is calculated from the calculated input pin capacitance.

The input pin capacitance calculating step preferably includes:

a combination setting step in which a type of combination selected from combinations of an input slew of the cell, a drive load capacitance of the cell and an input waveform state of an input signal waveform of the cell (rise/fall) is set;

a current amount calculating step in which a volume of a current running into the input terminal during a period when an initial voltage of the input signal waveform reaches the specified voltage in the combination is measured in a circuit simulation;

a charge calculating step in which the current volume is integrated based on a time length of the period so as to calculate a charge;

an input pin capacitance calculating step in which the charge is divided by a difference between the initial voltage and the specified voltage so as to calculate an input pin capacitance in the combination;

a step of judging whether or not the input pin capacitance is calculated in all of the combinations and returning to the combination setting step when the calculation has not yet completed; and a library registering step in which functions of the input slew and the drive load capacitance are set and registered in a library respectively when the input signal waveform rises and falls.

According to the delay calculating method, the input pin capacitance of the time length relating to the delay time calculation, and the delay time can be highly accurately calculated.

A delay time calculating method in a semiconductor integrated circuit comprising a plurality of connected cells according to the present invention comprises:

a first input pin capacitance registering step in which a first input pin capacitance represented by one value for each cell and each input terminal of the cell is registered in a delay library;

a function setting step in which a function for calculating an input pin capacitance of the cell and expressing an input slew of the cell and a drive load capacitance of the cell in the form of arguments is set;

a second input pin capacitance calculating step in which the input slew of the cell and the drive load capacitance of the cell are assigned to the function so as to calculate a second input pin capacitance;

a capacitance difference calculating step in which a difference between the first input pin capacitance and the second input pin capacitance is calculated;

a wire capacitance calculating step in which a first wire capacitance and a first resistance are generated from a layout information of the cell and the capacitance different is additionally written in the generated first wire capacitance and the first resistance so as to calculate a second wire capacitance and a second resistance; and a delay time calculating step in which a delay time is calculated from the second wire capacitance, the second resistance, the first input pin capacitance and a cell connection information of the cell.

The wire capacitance calculating step is preferably constituted as follows. The capacitance difference is further additionally written in a wiring capacitance linked to the input terminal of the cell in the wire capacitance calculating step.

According to the foregoing constitution, when the input pin capacitance conventionally registered in the delay library is registered as one value, the difference with respect to the input pin capacitance calculated based on the function expressing the input slew and the drive load capacitance of each instance in the form of the arguments is added as the wiring capacitance so that the delay can be calculated without changing the conventional mechanism of the delay calculation, allowing the calculation to be highly accurate.

Further, a delay time calculating method in a semiconductor integrated circuit comprising a plurality of connected cells according to the present invention comprises:

a function setting step in which a function for calculating a second input slew in an internal signal line of the cell and expressing a first input slew of the cell calculated in advance without including a coupling capacitance between the input terminal of the cell and the internal signal line of the cell in the form of an argument is set;

a coupling capacitance calculating step in which a wire capacitance and an resistance in the cell are inputted so as to calculate the coupling capacitance between the input terminal of the cell and the internal signal line of the cell;

an equivalent capacitance calculating step in which the first input slew is assigned to function so as to calculate the second input slew of the signal line, an equivalent capacitance is calculated from the first input slew, the second input slew and the coupling capacitance, and a result of the calculation is recited in an equivalent capacitance information; and a delay calculating step in which a delay library of the cell, the wire capacitance of the cell, the resistance of the cell, the cell connection information of the cell and the equivalent capacitance information are inputted so as to calculate a drive load capacitance, the equivalent capacitance is added to the calculated drive load capacitance, and a delay time is calculated based on a result of the addition.

According to the foregoing constitution, the coupling capacitance, which was not conventionally considered, is replaced with the equivalent capacitance for the delay calculation. As a result, the delay time can be highly accurately calculated.

A cell characterizing method for generating a library used in delay calculation in a semiconductor integrated circuit comprising a plurality of connected cells according to the present invention comprises:

an input pin capacitance calculating step in which a characteristic is extracted based on an average of input slews in a cell generation to be characterized and an average of drive load capacitances in the cell generation to be characterized, or an average of an input slew in each cell and an average of a drive load capacitance in each cell so as to calculate an input pin capacitance; and a step of registering the input pin capacitance value calculated in the input pin capacitance calculating step in the library as an input pin capacitance of the cell to be characterized.

According to the cell characterizing method, the input pin capacitance value more approximate to the actual circuit is obtained before the delay calculation in contrast to the method of using the one representative value of the input pin capacitance. As a result, the delay calculation of a high accuracy is realized.

A cell characterizing method at a more specific level comprises:

a coupling capacitance calculating step in which a coupling capacitance between an input terminal of the cell and an internal signal line of the cell is calculated; and a function expressing step in which an input pin capacitance of the cell at which the calculated coupling capacitance is equal to or more than a specified value is expressed in the function calculated in above-mentioned function setting step.

In the case where the cell whose coupling capacitance between the input terminal of the cell and the internal signal line of the cell is large, the input pin capacitance largely changes, which results in the generation of an error in the delay calculation when the one representative value is used for the expression. Such a disadvantage can be solved by setting the function.

As another possible constitution, a cell characterizing method for generating a library used in delay calculation in a semiconductor integrated circuit comprising a plurality of connected cells according to the present invention comprises:

a distance calculating step in which a distance between an input terminal of the cell and an internal signal line of the cell is calculated; and a function expressing step in which an input pin capacitance of the cell at which the calculated distance is equal to or below a specified value is expressed in the function calculated in above-mentioned function setting step.

To describe the foregoing constitution, the distance between the input terminal of the cell and the internal signal line of the cell is previously obtained from the layout of the cell in place of referencing the value of the coupling capacitance between the input terminal of the cell and the internal signal line of the cell. The reference value is set for the distance. Then, the cell in which the obtained distance is equal to or below the reference value is judged to have a large coupling capacitance, and input pin capacitance of the cell assumed to have the large capacitance is expressed in the form of the function.

According to the present invention, the input pin capacitance value can be calculated in such manner that the error is minimized in each instance. As a result, the accuracy of the delay calculation can be improved.

As a result of employing the delay calculating method in the semiconductor integrated circuit and the cell characterizing method according to the present invention, the input pin capacitance of the cell can be more accurately obtained, and the delay calculation can be handled in response to a virtual input pin capacitance variation which has been raised as an issue in recent years. Further, the present invention can be realized in such manner that steps are added to the delay calculating technology conventionally available, wherein the delay calculation can be performed with a higher accuracy. In the cell characterizing method, steps can be further provided in the conventional method in the same manner so that the input pin capacitance can be more accurately obtained.

BRIEF DESCRIPTION OF THE DRAWINGS

These and other objects as well as advantages of the invention will become clear by the following description of preferred embodiments of the invention. A number of benefits not recited in this specification will come to the attention of the skilled in the art upon the implementation of the present invention.

FIG. 1 is a flow chart illustrating processing steps of a delay calculating method in a semiconductor integrated circuit according to an embodiment 1 of the present invention.

FIG. 2 is a table illustrating a relationship between an input slew and an input pin capacitance according to the embodiment 1.

FIG. 3 is a table illustrating a relationship among the input slew, a drive load capacitance and the input pin capacitance according to the embodiment 1.

FIG. 5 is a table illustrating a relationship between a drive load capacitance and an input pin capacitance according to the embodiment 2.

FIG. 6 is a flow chart illustrating processing steps of a delay calculating method in a semiconductor integrated circuit according to an embodiment 3 of the present invention.

FIG. 7 is a flow chart illustrating processing steps of a delay calculating method in a semiconductor integrated circuit according to an embodiment 4 of the present invention.

FIG. 9 is a flow chart illustrating cell characterizing processing steps according to the embodiment 4.

FIG. 10 is a flow chart illustrating another cell characterizing processing steps according to the embodiment 4.

FIG. 12 is a flow chart illustrating details of an input pin capacitance calculating step according to the embodiment 5.

FIG. 16 is a table illustrating details recited in a parasitic component information according to the embodiment 6.

FIG. 17 is a table illustrating the details recited in the parasitic component information according to the embodiment 6.

FIG. 19 shows a replacement of a coupling capacitance with an equivalent capacitance according to the embodiment 7.

DETAILED DESCRIPTION OF THE INVENTION

Figure 4:
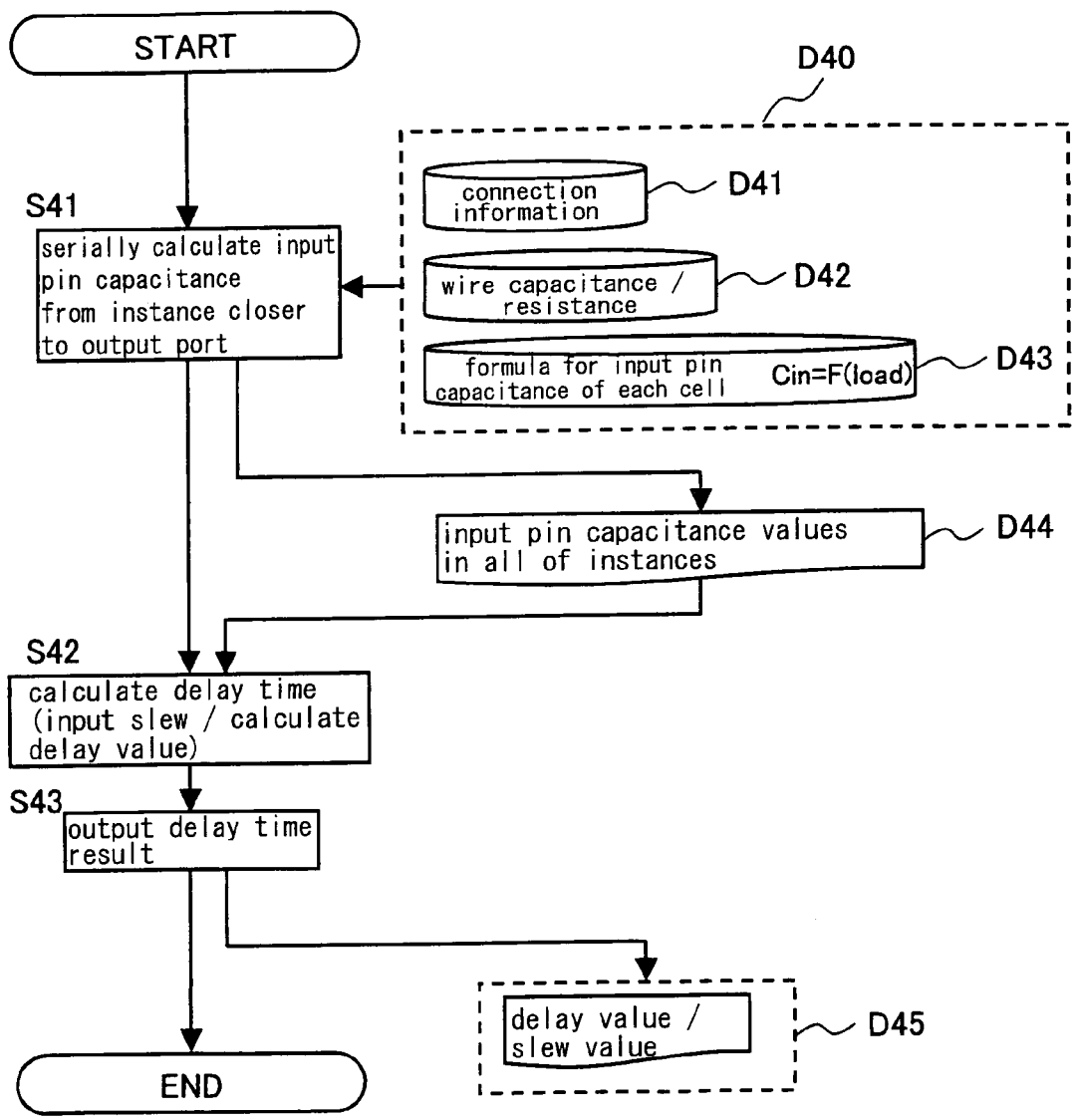
FIG. 4 is a flow chart illustrating processing steps of a delay calculating method in a semiconductor integrated circuit according to an embodiment 2 of the present invention.

Hereinafter, preferred embodiments of the present invention are described referring to the drawings.

EMBODIMENT 1

FIG. 1 is a flow chart illustrating processing steps of a delay calculating method in a semiconductor integrated circuit according to an embodiment 1 of the present invention. An initial input data D10 includes a connection information D11 of a cell, a delay library D12 as an input to a delay calculating process and a wire capacitance/resistance value D13. In the delay library D12 in the initial input data D10, one representative value, which is first used in the delay calculation repeated a plurality of times in the processing, is described as an input pin capacitance value of each cell.

First, a function D15 for calculating the input pin capacitance of each cell constituting the semiconductor integrated circuit and expressing an input slew in each instance (how round an input pulse is, in other words, tilt of an input waveform) in the form of an argument is generated per cell based on a result of extracting a characteristic in the library (cell characterizing). The input slew is an example of a predetermined parameter.

In Step S11, the data D10 is inputted so as to calculate a value of the input slew in each instance in the same manner as in a conventional delay calculating processing. More specifically, the delay library of each cell, wire capacitance and resistance of each cell, initial value of the input pin capacitance of the cell and cell connection information of the cell are inputted so as to calculate the input slew in each instance constituting the cell. A input slew value D14 of each instance obtained in the calculation is stored in a memory of a calculator or temporarily outputted as a file.

Next, in Step S12, the input slew value D14 in each instance and the function D15 generated in advance are inputted so as to calculate the input pin capacitance of each instance. An input pin capacitance value D16 of each instance obtained by the calculation of the input pin capacitance in the Step S12 is recorded in the memory of the calculator or in the form of the temporary output as the file.

Next, in Step S13, the input pin capacitance value D16 in each instance is used so as to calculate the delay again.

Next, in Step S14, it is judged whether or not a variation of the calculated input pin capacitance value D16 is within a range of at most a reference value. The result of the calculation of the input pin capacitance executed in the Step S12 is compared to the last result of the input pin capacitance (reference value of the input pin capacitance in the case of the first result). When it is judged that a ratio of the variation in the input pin capacitance value exceeds the reference value as a result of the comparison in the Step S14, the delay calculation is repeated. More specifically, the input pin capacitance used in the previous delay calculating Step S11 is replaced with the input pin capacitance value D16 in the Step S15, and then, the delay calculation of the Step S11 and processes thereafter are repeated. When it is judged that the ratio (or dimension) of the variation is within the range of at most the reference value in the comparison in the Step S14, the processing advances to Step S16, in which a delay calculation result D17 is outputted.

In the described manner, the delay calculation can be executed with influences of the input slew value and other parameters in an actual circuit being reflected on the input pin capacitance. More specifically, in actual LSI, the input slew with respect to each instance is calculated and the input pin capacitance value dependent on the input slew is calculated for each instance for the delay calculation. As a result, the input pin capacitance value can be calculated in such manner that the error is minimized in each instance of each LSI. Thereby, the delay calculation is expected to be more accurate.

Next, the function D15 of the input pin capacitance is described. It is already known that the input pin capacitance depends on the input slew. The input pin capacitance can be expressed in a table shown in FIG. 2 as an exemplary table of the input slew.

In FIG. 2, Slew1, Slew2 and Slew3 are each the input slew and corresponds to the input slew in the cell characterizing process. Cin1, Cin2 and Cin3 are each the input pin capacitance when the input slew is Slew1, Slew2 or Slew3. Provided that the input slew as the parameter of the input pin capacitance is P, the input pin capacitance Cin can be expressed in a quadratic equation (1).

$$Cin = k_1 P^2 + k_2 P + a \quad (1)$$

In the foregoing equation, $K_1$ and $K_2$ denote coefficients, and a denotes a constant. These constants can be easily obtained in a parameter fitting process according to a least square method or the like in which the input slew and the input pin capacitance value shown in FIG. 2 are used.

Next, another function of the input pin capacitance is described. It is known that the input pin capacitance depends on the input slew and the drive load capacitance. For example, the input pin capacitance of a cell can be expressed in a table (Cin11-Cin34) based on the input slew (Slew1-Slew3) and the drive load capacitance (Load1-Load4) as indices as shown in FIG. 3.

These input pin capacitance values can be expressed in a quadratic equation (2) as a function of an input slew P and a drive load capacitance Q.

$$Cin = k_1 P^2 + k_2 P + k_3 Q^2 + k_4 Q + b \quad (2)$$

In the equation (2), $K_1$ and $K_2$ denote coefficients by which the input slew P is multiplied, $K_3$ and $K_4$ denote coefficients by which the drive load capacitance Q is multiplied, and b is a constant. These coefficients and constant can be determined by means of values in the table shown in FIG. 3. Thereby, the input pin capacitance value when deviated from the indices can be more accurately obtained.

Further, the input pin capacitance can be more accurately obtained when the input pin capacitance is expressed in the function dependent on not only the input slew P but also the drive load capacitance Q in comparison to the equation (1).

EMBODIMENT 2

FIG. 4 is a flow chart illustrating processing steps of a delay calculating method in a semiconductor integrated circuit according to an embodiment 2 of the present invention. Referring to reference symbols in FIG. 4, D40 denotes an input data with respect to the delay calculation flow, D41 denotes the connection information of the cell, D42 denotes a result of extracting the wire capacitance/resistance, and D43 denotes a function of the input pin capacitance obtained per cell.

The function D43 is a function for calculating an input pin capacitance of an inductance constituting the cell constituting the semiconductor integrated circuit. In the function D43, the input slew of the cell and the drive load capacitance of the cell are expressed in the form of arguments. The function D43 is generated in advance per cell.

In Step S41, the data D40 is inputted so as to calculate the input pin capacitance value of each instance. In the case of the processing in the Step S41, the input terminal is serially obtained from the instance closer to an output terminal. An input pin capacitance value D44 of each instance obtained in the Step S41 is recorded in the file or the memory of the calculator.

Next, in Step S42, the input pin capacitance value D44 in each instance obtained in the Step S41 is inputted so as to calculate the delay. Next, a delay calculation result F45 is outputted in Step S43.

Below is described a function of the input pin capacitance used in the present embodiment. The input pin capacitance of the cell, which depends on the drive load capacitance, can be expressed in a table of the drive load capacitance as shown in FIG. 5. A calculation formula of the input pin capacitance can be expressed in the following formula (3).

$$Cin = k_3 Q^2 + k_4 Q + b \quad (3)$$

When the input pin capacitance Cin is expressed in a quadratic or higher equation, any dependence on the drive load capacitance can be obtained. When the table shown in FIG. 5 is used, $K_3$ and $K_4$ and the constant b can be obtained by means of the least square method or the like. When function D43 of the input pin capacitance thus obtained is used in the delay calculation according to the present embodiment, the delay can be more accurately calculated than in the gate-level delay calculation conventionally performed.

EMBODIMENT 3

FIG. 6 is a flow chart illustrating processing steps of a delay calculating method in a semiconductor integrated circuit according to an embodiment 3 of the present invention.

A function D66 for calculating the input pin capacitance of the inductance constituting the cell and expressing the input slew of the cell and the drive load capacitance of the cell in the form of arguments is generated per each cell.

Next, in Step S61, a circuit connection information D61, a library D62 and a wire capacitance/resistance D63 are inputted so as to calculate the delay in the conventional manner. Of the delay calculation result in the Step S61, an input slew information D64 in the entire instances is retained in such manner that the information is described in the file or memorized in the memory of the calculator.

Next, the values of the input slew D64 in the entire instances and the wiring parasitic capacity/resistance D63 of the circuit are inputted so as to execute a statistical processing in Step S62. In the Step S62, it is assumed that, for example, the statistical processing for obtaining an average value of the drive load capacity and an average value of the input slew in the cell in the circuit per cell is executed. A reference symbol D65 denotes the average input slew value per cell and the average drive load capacitance per cell, which are obtained in the statistical processing in the Step S62.

Next, in Step S63, the data D65 is inputted, and the input pin capacitance of each cell is calculated by means of the function D66 of the input pin capacitance per cell. A reference symbol D67 denotes the input pin capacitance value of each cell obtained in the Step S63.

Next, in Step S64, the input pin capacitance value D67 is used so as to execute a final delay calculation, and a delay calculation result D68 (delay information and slew information) and the like are outputted.

The input pin capacitance of the cell is practically dependent on the drive load capacitance and the input slew. According to the foregoing process, the input pin capacitance value in response to the status (input slew and drive load capacitance) generated in the actual circuit can be used so as to calculate the delay.

EMBODIMENT 4

FIG. 7 is a flow chart illustrating processing steps of a delay calculating method (cell characterizing method) in a semiconductor integrated circuit according to an embodiment 4 of the present invention.

First, in Step S71, an average value D71 of the input slew value of each cell, an average value D72 of the drive load capacitance of each cell and a parasitic RC information D73 of each cell to be characterized as an input required for characterizing process are inputted. The average values D71 and D72 are preferably obtained in accordance with a drive performance of the cell because the subsequent characterizing process can be thereby performed with a higher accuracy. The average values D71 and D72 should be obtained in each generation at a stage where a certain amount of design results has been stored and used in the cell characterizing process.

In the cell characterizing process in the Step S71, when the input slew average value D71 and the drive load capacitance average value D72 are used in obtaining the input pin capacitance of the cell, the input pin capacitance can be obtained based on the input slew and the drive load capacitance frequently used in the actual circuit. Thereby, it is anticipated that the delay calculation of a higher accuracy than in the conventional technology can be realized.

Figure 8:
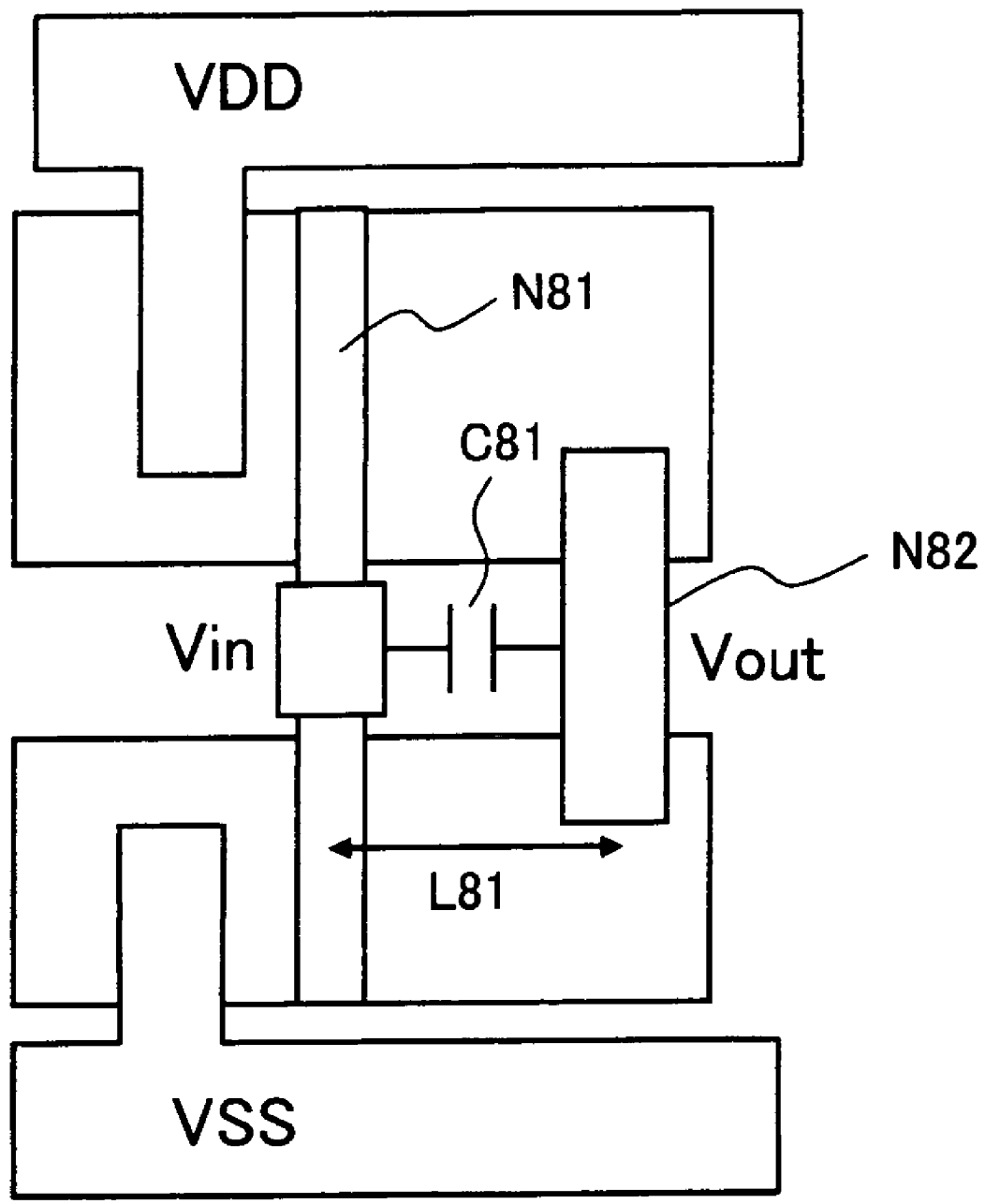
FIG. 8 is a cell layout according to the embodiment 4.

Next, a specific example of the cell characterizing process is described. FIG. 8 shows a layout of an inverter cell. Referring to reference symbols in the drawing, VDD denotes a power supply, VSS denotes ground, Vin denotes an input terminal of the inverter cell, Vout denotes an output terminal of the inverter cell, N81 denotes a node of the input terminal, N82 denotes a node of the output terminal, and C81 denotes a parasitic capacitance value between the node N81 and the node N82.

FIG. 9 is a flow chart illustrating cell characterizing processing steps in the delay calculating method according to the embodiment 4. First, in Step S91, a net list of the cell (connection data of parasitic capacitance/resistance) D 91 is inputted so as to execute the conventional cell characterizing.

A delay value of the cell and a slew value information D92 in the output terminal are outputted as a result of the cell characterizing process in the Step S91.

When a coupling capacitance between the input terminal of the cell and an internal signal line of the cell is relatively large, the input pin capacitance largely varies depending on the input slew and the drive load capacitance. A degree of the variation of the input pin capacitance is judged in Step S92. More specifically, in the Step S92, the coupling capacitance (see C81 in FIG. 8) between the input terminal of the cell and the internal signal line of the cell is compared to a specified value. When it is judged that the coupling capacitance is equal to or above the specified value in the Step S92, the input pin capacitance value is expressed in the form of a function (D93). When it is judged that the coupling capacitance is equal to or below the specified value in the Step S92, the processing advances to Step S94, in which a representative value is obtained as the input pin capacitance value (D94).

As described, the input pin capacitance is expressed in the form of the function with respect to only the cell in which the variation of the input pin capacitance is large. A representative value is registered in the library with respect to any cell not demanding the expression in the form of the function as in the conventional method, which enables only the input pin capacitance of any required part to be selectively obtained with a high accuracy.

FIG. 10 is a flow chart illustrating another cell characterizing processing steps according to the embodiment 4. The flow chart is different to that of FIG. 9 only in Step S92a.

First, in Step S91, the net list of the cell (connection data of parasitic capacitance/resistance) D91 is inputted so as to execute the conventional characterizing process. The delay value of the cell and the slew value information D92 in the output terminal are outputted as the cell characterizing result in the Step S91.

When a distance between the input terminal of the cell and the internal signal line of the cell is relatively small, the input pin capacitance largely varies depending on the input slew and the drive load capacitance. Therefore, the degree of the variation of the input pin capacitance is judged in the Step S92a. In the Step S92a, the distance between the input terminal of the cell and the internal signal line of the cell (see L81 in FIG. 8) is compared to a specified value. When the distance L81 is judged to be equal to or below the specified value in the Step S92a, the input pin capacitance value is expressed in the form of a function (D93). When the distance L81 is judged to be larger than the specified value in the Step S92a, the processing advances to Step S94, in which a representative value is obtained as the input pin capacitance value (D94).

As described, the input pin capacitance is expressed in the form of the function with respect to only the cell in which the variation of the input pin capacitance is large. A representative value is registered in the library with respect to any cell not demanding the expression in the form of the function as in the conventional technology, which enables only the input pin capacitance of any required part to be selectively obtained with a high accuracy.

The flow chart shown in FIG. 10 does not include the reference of the coupling capacitance value between the input terminal and the internal signal line as in the flow chart of FIG. 9. Therefore, the function of the input pin capacitance can be selectively set with respect to the cell in which the input pin capacitance largely varies in a shorter period of processing time.

EMBODIMENT 5

Figure 11:
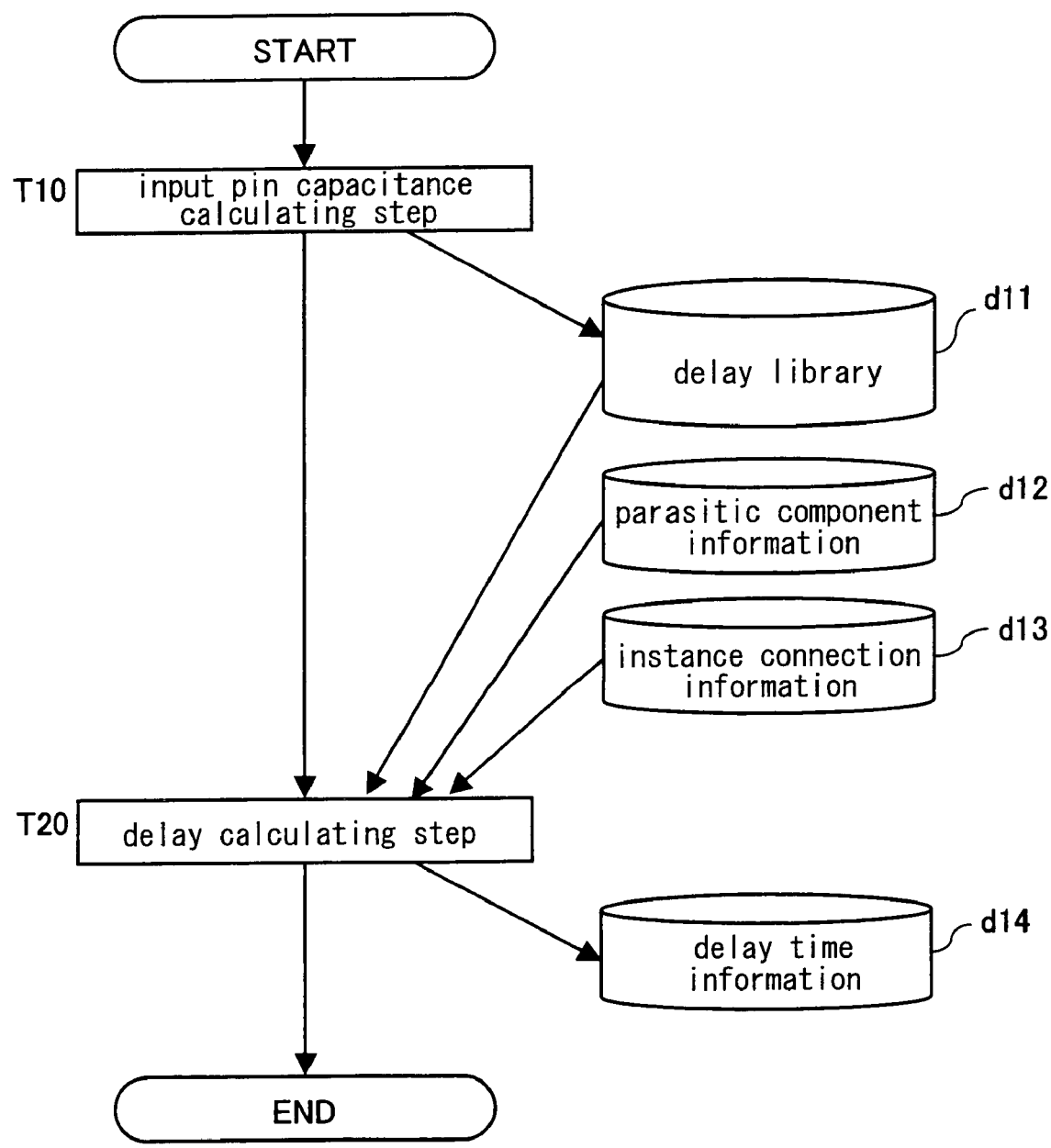
FIG. 11 is a flow chart illustrating processing steps of a delay calculating method in a semiconductor integrated circuit according to an embodiment 5 of the present invention.

FIG. 11 is a flow chart illustrating processing steps of a delay calculating method in a semiconductor integrated circuit according to an embodiment 5 of the present invention. Referring to reference symbols in the drawing, d11 denotes a delay library where the input pin capacitance of the cell is entered, d12 denotes a parasitic component information in which a capacitance value and a resistance value of the wiring are recited, d13 denotes an instance connection information in which a connecting relationship between the instances is recited, and d14 denotes a delay time information in which a delay time of each instance is recited.

FIG. 12 is a flow chart illustrating details of an input pin capacitance calculating step T10. A reference symbol m11 denotes a memory unit for memorizing a temporary data in a computer.

Figure 13A:
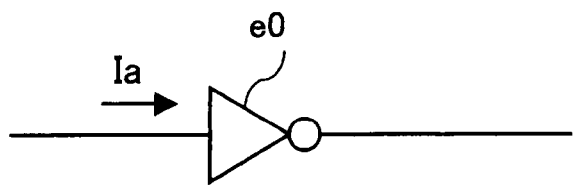
FIG. 13A shows a cell whose input pin capacitance is measured according to the embodiment 5.
Figure 13B:
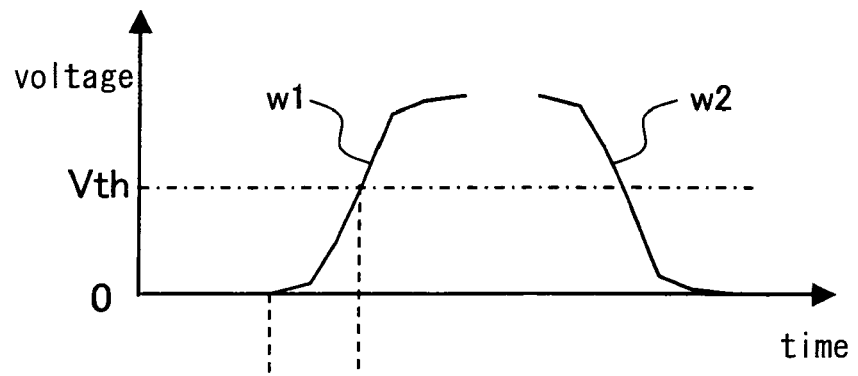
FIG. 13B shows a variation over time of an input terminal voltage according to the embodiment 5.
Figure 13C:
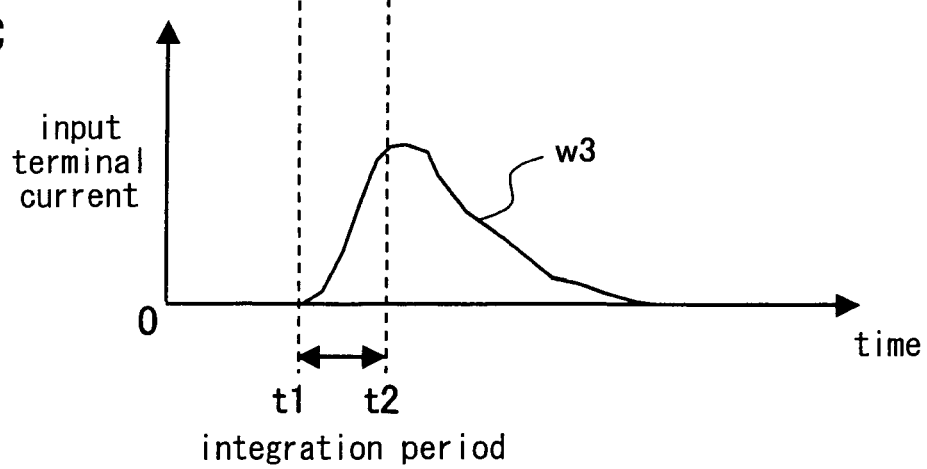
FIG. 13C shows a variation over time of a volume of a current running into an input terminal according to the embodiment 5.

FIGS. 13A-13C show a relationship between a signal waveform and a current running into the input terminal when the input pin capacitance is calculated. Referring to reference symbols in these drawings, e0 denotes a cell whose input pin capacitance is to be measured, w1 denotes an input signal waveform supplied to the input terminal of the cell e0, w2 denotes an output signal waveform of the cell e0, Ia denotes a current running into the cell e0, Vth denotes a specified voltage, w3 denotes a waveform of a current running into an input terminal of the cell e0, t1 denotes a time point when the input signal waveform w1 starts to shift, and t2 denotes a time point when the specified voltage Vth is reached. The specified voltage Vth is determined in advance.

Figure 14:
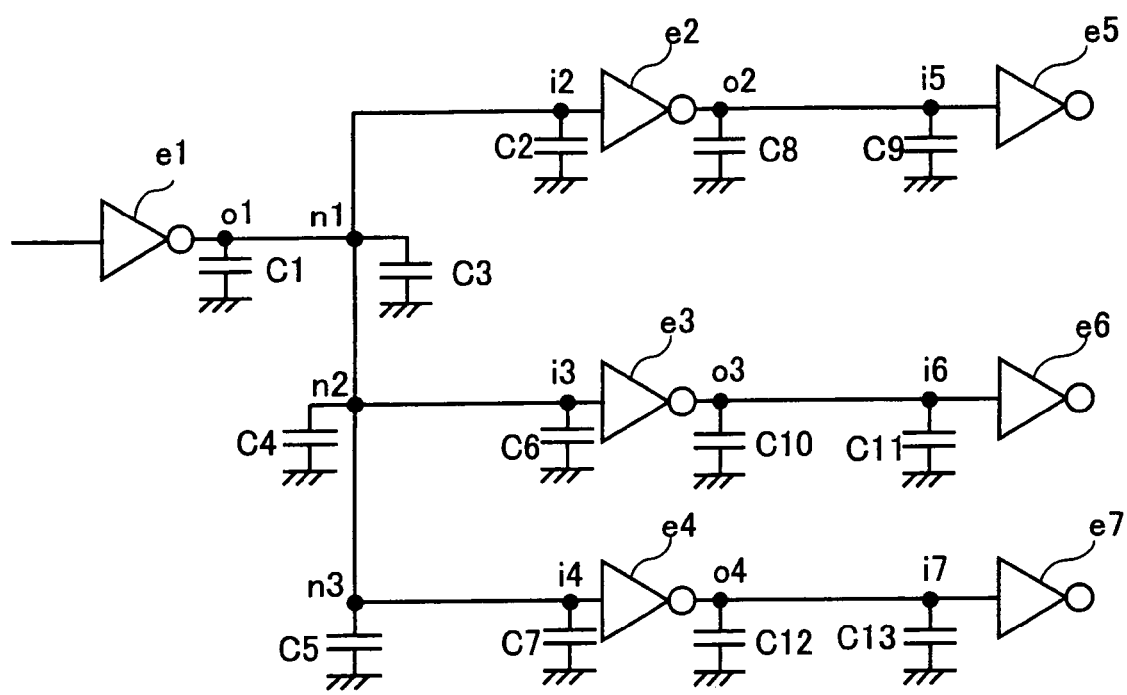
FIG. 14 is a diagram illustrating a connection information of instances according to the embodiment 5.

FIG. 14 shows the connection information of the instances. Reference symbols e1-e7 denote cells of the same type respectively uniquely named, more specifically denote instances each having a function of an inverter. Reference symbols o1, o2, o3 and o4 respectively denote output terminals of the instances e1, e2, e3 and e4. Reference symbols i2, i3, i4, i5, i6 and i7 are respectively input terminals of the instances e2, e3, e4, e5, e6 an e7. Reference symbols n1, n2 and n3 respectively denote wiring nodes. Reference symbols C1-C13 respectively denote wiring capacitances connected to the input terminals, output terminals and nodes.

An operation of the foregoing constitution is described below. The input pin capacitance calculating step T10 includes combination setting steps T11-T16 and a library registering step, wherein the input pin capacitance is calculated.

First, in the combination setting step T11, a type of combination selected from combinations of the input slew (how round the signal pulse is, in other words, tilt of the input signal waveform), drive load capacitance, state of the input signal waveform (if the input waveform rises or falls) of the cell e0 is set, and the set combination is memorized in the memory unit m11.

Next, in the current volume calculating T12, the combination memorized in the memory unit m11 is read, and the current Ia running into the input terminal of the cell e0 is measured in a circuit simulation and memorized in the memory unit m11. In the input signal waveform w1, a volume of the current Ia running into the input terminal of the cell e0 during a period when a voltage of the input signal waveform shifts from zero voltage to the specified voltage Vth is measured because the state of the input signal waveform shows the rise. When the state of the input signal waveform shows the fall, the volume of the current Ia running into the input terminal of the cell e0 during a period when the voltage of the input signal waveform shifts from a power-supply voltage to the specified voltage Vth is measured. The specified voltage Vth determined in advance is desirably a threshold voltage at which the delay time is measured.

Next, in the charge calculating step T13, the current volume Ia is read from the memory unit m11, and the read current volume Ia is integrated by the period (time length of the period when the voltage of the input signal waveform shifts from the initial voltage (zero voltage or power-supply voltage) to the specified voltage Vth so as to calculate a charge qa, and the calculated charge qa is memorized in the memory unit m11. The period is between Time t1 and Time t2. Therefore, the charge qa is expressed in the following formula (4).

$$qa = \int_{t1}^{t2} Ia \, dt \qquad (4)$$

Next, in the input pin capacitance calculating step T14, the charge qa is read from the memory unit m11 and divided by a difference between the initial voltage and the specified voltage so as to calculate an input pin capacitance Ca. Then, the calculated input pin capacitance Ca is memorized in the memory unit m11. The input pin capacitance Ca is calculated in the following formula (5), for example, when the state of the input signal waveform shows the rise. The input pin capacitance Ca is a value calculated in the combination.

$$Ca = \frac{qa}{Vth} \qquad (5)$$

Next, the judging step T15 is implemented. In the jugging step T15, it is judged whether or not the input pin capacitance is calculated in all of the combinations, and the processing returns to the combination setting step T11 when the calculation has not been completed yet.

When it is judged that the input pin capacitance is calculated in all of the combinations in the judging step T15, the library registering step T16 is implemented. In the library registering step T16, the input pin capacitance is read from the memory unit m11 for the respective states of the input signal waveform (rise/fall), and a function of the input pin capacitance in which the tilt of the input signal waveform and the drive load capacitance are expressed in the form of arguments is set and registered in a library m12.

Next, in a delay calculating step T20, the delay time is calculated from the delay library d11, parasitic component information d12 and instance connection information d13.

For example, referring to a case where the delay time of the instance e1 is calculated, first, the input pin capacitances of the instance e2, e3 and e4 are calculated from the delay library d11. The input slew and the drive load capacitance in the calculation of the input pin capacitance are previously calculated using a fixed value of the one value, which was conventionally used. Then, the delay time is calculated a plurality of times.

As described, according to the present invention, the input pin capacitance of the time length relating to the calculation of the delay time is calculated. As a result, the delay time can be highly accurately calculated.

EMBODIMENT 6

Figure 15:
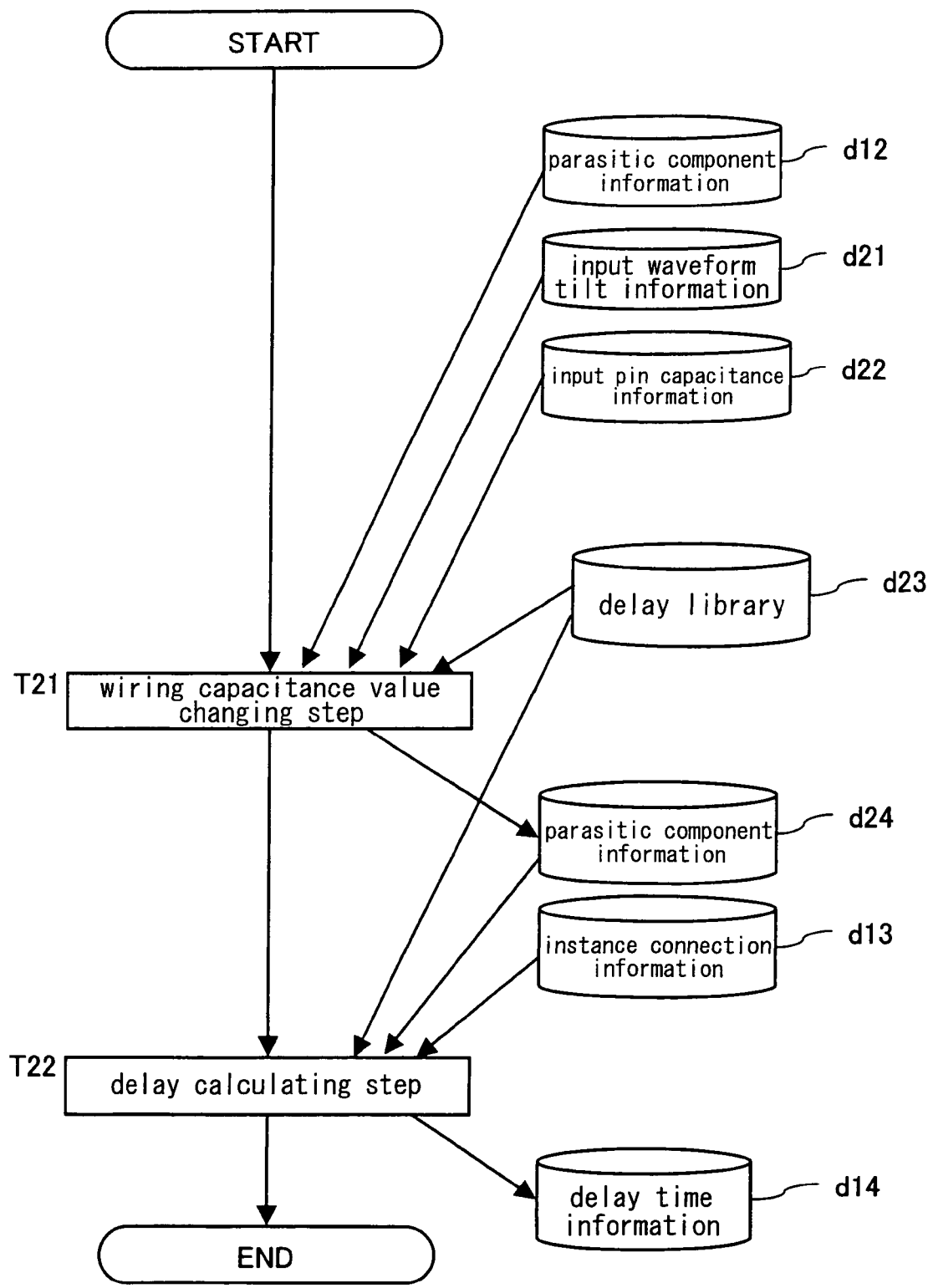
FIG. 15 is a flow chart illustrating processing steps of a delay calculating method in a semiconductor integrated circuit according to an embodiment 6 of the present invention.

FIG. 15 is a flow chart illustrating processing steps of a delay calculating method in a semiconductor integrated circuit according to an embodiment 6 of the present invention. Referring to reference symbols in the drawing, d21 denotes an input waveform tilt information in which the input slew of each instance is recited, d22 denotes an input pin capacitance information in which a function for calculating a second input pin capacitance of each cell is recited, d23 denotes a delay library in which a first input pin capacitance of the one value is registered per cell type, and d24 denotes a parasitic component information in which a difference between the first input pin capacitance registered in the delay library d23 and the second input pin capacitance calculated based on the function is additionally written.

FIG. 16 shows the details of the parasitic component information d24, wherein wiring capacitances C1-C7 connected to instances e1-e4. The wiring capacitance is expressed in the form of capacitance instance, node name, zero-potential node name and capacitance value per net. In FIG. 16, as an example, the inter-node wiring capacitance values are all denoted by 10 fG (femtofarad).

FIG. 17 shows the details of the parasitic component information d24. In FIG. 17, the capacitance values added to a net 1 shown in FIG. 16 are denoted by ΔC2, ΔC6, ΔC7.

An operation of the foregoing constitution is described below. The first input pin capacitance expressed by the one value is previously registered per cell and input terminal of each cell in the delay library (first input pin capacitance registering step). Further, a function for calculating the input pin capacitance of the cell in which the respective input slews of the instances e2, e3, and e4 and the drive load capacitances connected to the outputs thereof are expressed in the form of arguments is set and recited in the input pin capacitance information d22 (function setting step).

Then, in a wiring capacitance changing step T21, first, the parasitic component information d12, input slew in the input waveform tilt information d21, input pin capacitance information d22 and delay library d23 are inputted so as to generate and output the parasitic component information d24. The parasitic component information d24 includes a first wire capacitance and a first resistance.

Further, the function recited in the input pin capacitance information d22 is read. Then, the input slews of the respective instances e2, e3 and e4 and the drive load capacitances connected to the outputs thereof are assigned to the read function so that the second input pin capacitance is calculated (second input pin capacitance calculating step)

Provided that the calculated second input pin capacitances of the instances e2, e3 and e4 are respectively referred to as C2, C6 and C7, and the first input pin capacitance of the cell corresponding to the instances e2, e3 and e4 registered in the delay library d23 is referred to as Ca, the respective capacitance differences are respectively calculated in the following formulas (6)-(8) (capacitance difference calculating step).

$$\Delta C2 = C2 - Ca \quad (6)$$

$$\Delta C6 = C6 - Ca \quad (7)$$

$$\Delta C7 = C7 - Ca \quad (8)$$

The capacitance differences ΔC2, ΔC6, ΔC7 are added so as to calculate and output the parasitic component information d24. The parasitic component information d24 includes the second wire capacitance and the second resistance (wire capacitance calculating step).

Provided that the input pin capacitances C2, C6, C7 are respectively 5fF, 6fF and 7fF and the input pin capacitance Ca is 8fF, the capacitance differences ΔC2, ΔC6, ΔC7 are respectively ΔC2=−3fF, ΔC6=02fF and ΔC7=−1fF.

In a delay calculating step T22, the delay library d23, parasitic component information d24 and instance connection information d13 are inputted so as to calculate the delay time and output the delay time information d14 (delay time calculating step).

In the case where the first input pin capacitance Ca is registered as the one value in the delay library in the conventional manner, the delay can be calculated when the difference between the first input pin capacitance Ca and the second input pin capacitance Ci calculated via the function in which the input slew and the drive load capacitance per instance are expressed in the form of the arguments is added as the wiring capacitance. In this case, the delay calculation can be performed without changing the conventional mechanism of the delay calculation, allowing the delay calculation to be highly accurate.

The first wire capacitance and the first resistance additionally including the capacitance value is recited in the parasitic component information d24, however, the capacitance value may be additionally written in the wiring capacitance value connected to the input terminal.

EMBODIMENT 7

Figure 18:
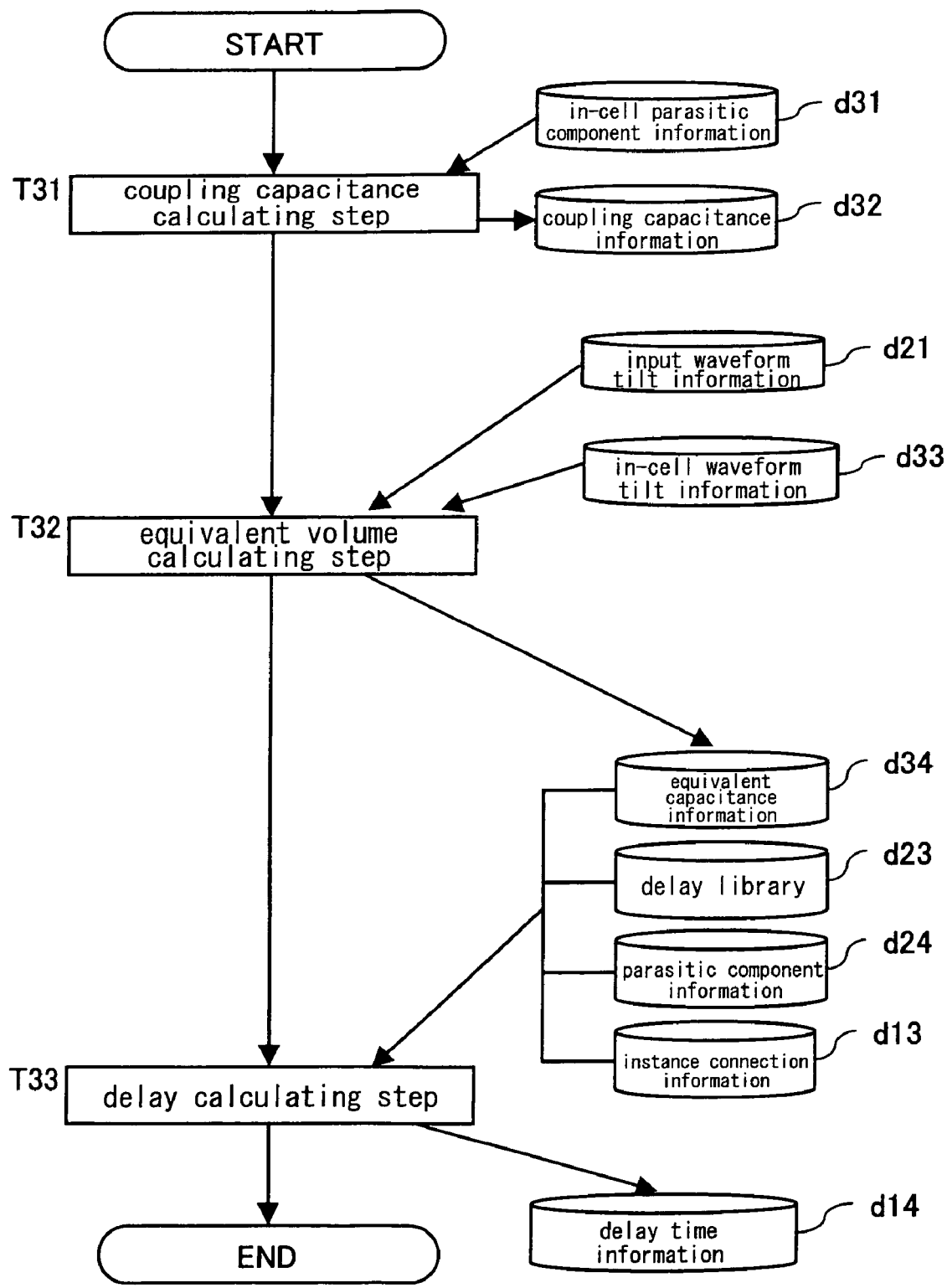
FIG. 18 is a flow chart illustrating processing steps of a delay calculating method in a semiconductor integrated circuit according to an embodiment 7 of the present invention.

FIG. 18 is a flow chart illustrating processing steps of a delay calculating method in a semiconductor integrated circuit according to an embodiment 7 of the present invention. Referring to reference symbols in the drawing, d31 denotes a parasitic component information in which a parasitic component of the cell is recited, d32 denotes a coupling capacitance information in which a coupling capacitance between the input terminal and the internal signal line of the cell is recited, and d33 denotes an in-cell waveform tilt information in which a waveform tilt in the internal signal line of the cell is recited. The in-cell waveform tilt information d33 previously measures a plurality of input slews. A reference symbols d34 denotes an equivalent capacitance information in which a equivalent capacitance calculated from the coupling capacitance, waveform tilt at the input terminal and waveform tilt in the internal signal line of the cell are recited.

FIG. 19 shows a replacement of the coupling capacitance with the equivalent capacitance. Referring to reference symbols in the drawings, w4 denotes a signal waveform inputted to the cell e0, w5 denotes a signal waveform inside the cell e0, Cb denotes a coupling capacitance between the input terminal of the cell e0 and the internal signal line of the cell e0, and Ce denotes an equivalent capacitance of the coupling capacitance Cb.

An operation according to the embodiment 7 constituted as above is described below.

First, a function for calculating the equivalent capacitance in the internal signal line of the cell is set. In the function, a waveform tilt Pa in the input terminal of the cell and a waveform tilt Pb in the internal signal line of the cell are expressed in the form of arguments (function setting step).

The waveform tilt Pa and the waveform tilt Pb are calculated in advance in such manner that the coupling capacitance between the input terminal of the cell and the internal signal line of the cell is not included. The waveform tilt Pb is calculated from the waveform tilt Pa in reference to the in-cell waveform tilt information. The waveform tilt Pa and the waveform tilt Pb correspond to the first input slew. The equivalent capacitance corresponds to the second input slew.

Then, in a coupling capacitance calculating step T31, the coupling capacitance between the input terminal and the internal signal line of the cell is calculated from the in-cell parasitic component information d31 (including resistance).

Next, in an equivalent capacitance calculating step T32, the waveform tilt Pa and the waveform tilt Pb, which were calculated in advance, are assigned to the function so as to calculate the equivalent capacitance.

Next, in a delay calculating step T33, the delay library d23, parasitic component information d24 and instance connection information d13 are inputted so as to calculate the drive load capacitance, and the equivalent capacitance is added to the calculated drive load capacitance. Then, the delay time is calculated based on a result of the addition.

As described, according to the present embodiment, the coupling capacitance, which was not considered in the conventional technology, is replaced with the equivalent capacitance for the delay calculation. As a result, the delay time can be highly accurately calculated.

While there has been described what is at present considered to be preferred embodiments of this invention, it will be understood that various modifications may be made therein, and it is intended to cover in the appended claims all such modifications as fall within the true spirit and scope of this invention.

What is claimed is:

1. A method for calculating an input pin capacitance of a cell, the method comprising:
   a first step of inputting an input slew and a drive load capacitance of said cell;
   a second step in which a circuit simulation is performed by a processor using said input slew and said drive load capacitance to calculate said input pin capacitance; and
   a third step of outputting said input pin capacitance of said cell.

2. A method according to claim 1, wherein:
   a plurality of sets of combinations of said input slews and said drive load capacitances are inputted in said first step, and
   said circuit simulation is performed repeatedly using said plurality of sets of combinations of said input slews and said drive load capacitances in said second step until an input pin capacitance for each of said plurality of sets of combinations is calculated.

3. A method according to claim 1, wherein a current running into an input terminal of said cell is measured when said circuit simulation is performed.

4. A method according to claim 3, wherein said current is measured until an input signal waveform reaches a specified voltage when said circuit simulation is performed.

5. A method according to claim 4, wherein said current is measured during a period when said input signal waveform shifts from zero voltage until reaching to said specified voltage in case said input signal waveform is rising and said current is measured during a period when said input signal waveform shifts from a power-supply voltage until reaching said specified voltage in case said input signal waveform is falling.

6. A method according to claim 4, wherein said specified voltage is a threshold voltage at which a delay time is measured.

7. A library including an input pin capacitance of a cell which is calculated by said method according to claim 1.

8. A delay calculating method using a library according to claim 7.

* * * * *